(12) United States Patent  (10) Patent No.: US 6,320,433 B1
Hinterscher                (45) Date of Patent: Nov. 20, 2001

(54) OUTPUT DRIVER

(75) Inventor: Eugene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/649,393

(22) Filed: Aug. 28, 2000

Related U.S. Application Data

(60) Provisional application No. 60/155,304, filed on Sep. 21, 1999.

(51) Int. Cl.$^7$ .............................. H03B 1/00; H03K 3/00
(52) U.S. Cl. ...................... 327/112; 327/376; 327/377; 327/384; 326/86; 326/87; 326/27; 326/30
(58) Field of Search .................... 327/108–112, 170, 327/384, 374–377; 326/81–83, 86, 87, 17, 21–24, 26–28, 30

(56) References Cited

U.S. PATENT DOCUMENTS

| | | | |
|---|---|---|---|
| 5,140,194 | * 8/1992 | Okitaka | 326/87 |
| 5,585,740 | * 12/1996 | Tipon | 326/86 |
| 5,726,583 | * 3/1998 | Kaplinsky | 326/86 |
| 5,838,186 | * 11/1998 | Inoue | 327/374 |

* cited by examiner

*Primary Examiner*—Terry D. Cunningham
*Assistant Examiner*—Long Nguyen
(74) *Attorney, Agent, or Firm*—Pedro P. Hernandez; W. James Brady, III; Frederick J. Telecky, Jr.

(57) ABSTRACT

One aspect of the invention is an integrated circuit (10,110) comprising a digital circuit operable to generate a first signal (21,111) and a driver circuit (20 and 30, 120 and 130) coupled to the signal generating circuit (21,111) and to an output load (40, 140). The driver circuit (20 and 30, 120 and 130) comprises a first transistor (MDA,MODA) operable to sink a first amount of current from an output node (38, 138) when activated and a second transistor (MDC,MODC) operable to sink a second amount of current from the output node (38, 138) when activated. The driver circuit (20 and 30, 120 and 130) also comprises a third transistor (MP1, MP4) coupled to the first transistor (MDA,MODA) and operable to activate the first transistor (MDA,MODA) and the second transistor (MDC,MODC) in response to a transition of a first signal. The driver circuit (20 and 30, 120 and 130) further comprises at least one resistive element (R3, R6) coupled to the second transistor (MDC,MODC) and to the third transistor (MP1, MP4) that is operable to delay activation of the second transistor (MDC,MODC) until after activation of the first transistor (MDA,MODA).

12 Claims, 1 Drawing Sheet

OUTPUT DRIVER

This application claims priority under 35 USC §119(e)(1) of provisional application Ser. No. 60/155,304 filed Sep. 21, 1999.

TECHNICAL FIELD OF THE INVENTION

This invention relates generally to the field of integrated circuits and more particularly to output drivers.

BACKGROUND OF THE INVENTION

Integrated circuits often employ driver circuitry to drive output loads such as those connected to a bus or backplane. Applications having long transmission lines connected to the driver may cause undesirable reflections back to the driver circuitry, resulting in ringing on the outputs of an integrated circuit. Therefore, an output driver is needed that efficiently reduces ringing but maintains high speed operation.

SUMMARY OF THE INVENTION

One aspect of the invention is an integrated circuit comprising a digital circuit operable to generate first signal and a driver circuit coupled to the signal generating circuit and to an output load. The driver circuit comprises a first transistor operable to sink a first amount of current from an output node when activated and a second transistor operable to sink a second amount of current from the output node when activated. The driver circuit also comprises a third transistor coupled to the first transistor and operable to activate the first transistor and the second transistor in response to a transition of a first signal. The driver circuit further comprises at least one resistive element coupled to the second transistor and to the third transistor that is operable to delay activation of the second transistor until after activation of the first transistor.

The invention provides several important advantages. Various embodiments of the invention may have none, some, or all of these advantages. The invention may control ringing on outputs without interfering significantly with switching speeds of an integrated circuit. By gradually turning on a series of output driver transistors, ringing is reduced. The invention achieves these advantages with circuitry that does not consume significant area on an integrated circuit. The invention allows integrated circuits to be coupled to long transmission lines. Integrated circuits, including applications using DIMM technology, may also be designed without detailed knowledge of transmission line lengths.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Figure 1:
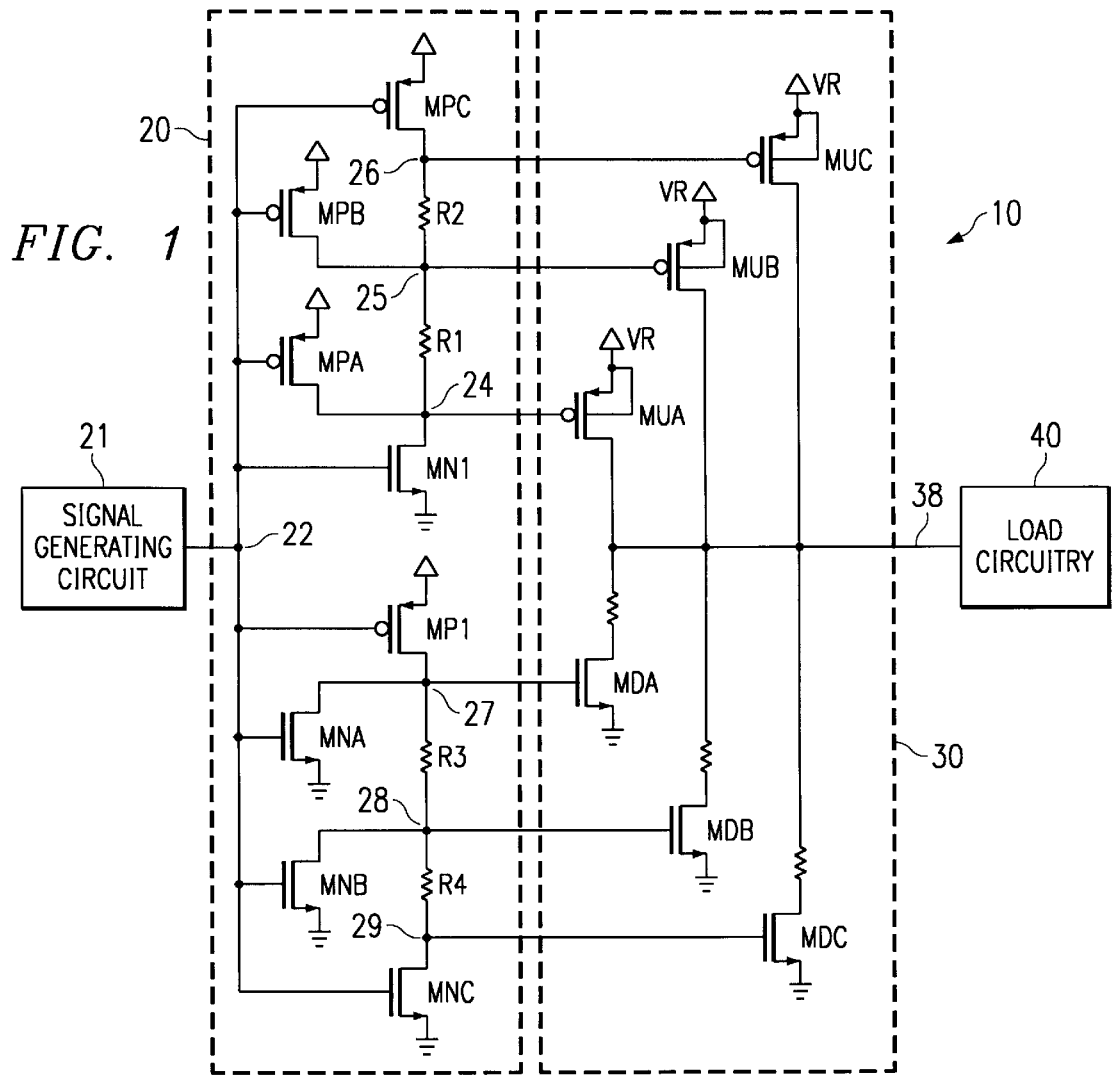
FIG. 1 illustrates a schematic diagram of a first embodiment of an integrated circuit constructed in accordance with the teachings of the present invention.
Figure 2:
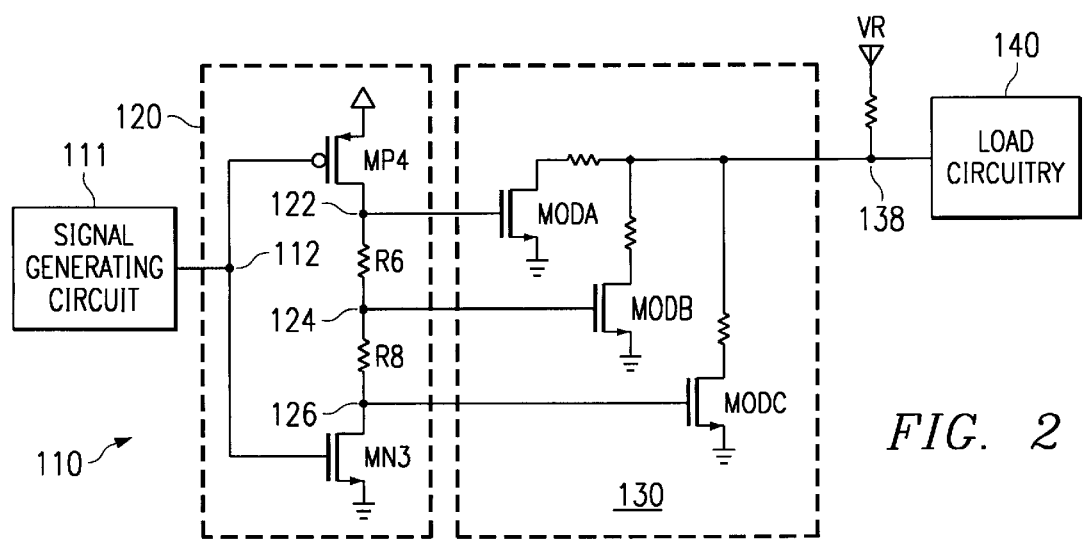
FIG. 2 illustrates a schematic diagram of a second embodiment of an integrated circuit constructed in accordance with the teachings of the present invention.

The present invention and its advantages are best understood by referring to FIGS. 1 and 2, like numerals being used for like and corresponding parts of the drawings.

FIG. 1 illustrates a schematic diagram of a first embodiment of an integrated circuit 10 constructed in accordance with the teachings of the present invention. It comprises signal generating circuit 21 and an output driver circuit, which comprises driver control circuit 20 and driver circuit 30. Signal generating circuit 21 comprises any type of circuit generating a digital signal level. Integrated circuit 10 may be coupled to load circuitry 40. Any load circuitry 40 may be coupled to driver circuit 30, but will typically be digital. Although direct connections are illustrated for various elements, elements may be coupled through other elements without departing from the scope of the invention.

As further detailed below, driver control circuit 20 may control sharp edge transitions of a waveform output to load circuitry 40 by activating the plurality of transistors of driver circuit 30 one at a time. By delaying the activation of pull-up or pull-down transistors, the current sourced or sinked by the output driver will increase or decrease more gradually and damp the ringing effect of rapid edge transitions.

In this embodiment, driver control circuit 20 comprises a lower cell and an upper cell, each coupled to node 22 and driver circuit 30. The lower cell comprises a p-channel MOSFET MP1, three N-channel MOSFETs MNA, MNB and MNC, and resistors R3 and R4. Similarly, the upper cell comprises N-channel MOSFET MN1, three P-channel MOSFETs MPA, MPB and MPC, and resistors R1 and R2. The sources of transistors MPA, MPB and MPC may be coupled to a suitable reference voltage VR, and the sources of transistors MNA, MNB and MNC may be coupled to ground. The gates of each of the transistors are coupled to node 22 and the drains of each of the transistors are each coupled to a respective portion of driver circuit 30, at nodes 24 through 29 respectively. Resistor R1 couples node 24 to node 25 and resistor R2 couples node 25 to node 26. Similarly, resistor R3 couples node 27 to node 28 and resistor R4 couples node 28 to node 29.

Driver circuit 30 similarly comprises a lower output cell and an upper output cell. Each cell comprises three portions. The upper cell comprises p-channel MOSFETs MUA, MUB and MUC, the sources of which are coupled to a suitable reference voltage VR. The gates of transistors MUA, MUB and MUC are each coupled to nodes 24, 25, and 26 of driver control circuit 20 respectively. The drains of PMOS transistors MUA, MUB and MUC are coupled to node 38. The lower cell comprises n-channel MOSFETs MDA, MDB and MDC, the sources of which are coupled to ground. The gates of transistors MDA, MDB and MDC are each coupled to nodes 27, 28, and 29 of driver control circuit 20 respectively. The drains of NMOS transistors MDA, MDB and MDC may each be coupled through a resistor to node 38.

It is also within the scope of the invention to utilize any number of transistors in driver circuit 30, in conjunction with analogous control circuitry. The upper and lower cells for driver circuit 30 may comprise different numbers of transistors. In addition, control circuitry 20 could provide equal delay. through the use of resistive elements to multiple transistors in driver circuit 30. For example, resistor R4 could be omitted.

In operation, driver control circuit 20 controls the output driver to limit the speed at which current is sourced or sinked during edge transitions of a signal at output node 38. When a voltage applied to input node 22 transitions from a low-to-high level, driver control circuit 20 activates the upper output cell and deactivates the lower output cell. When the voltage reaches a gate-source threshold Vgs, transistor MN1 of the upper cell and transistors MNA, MNB and MNC of the lower cell are activated, or turned on. Transistors MNA, MNB and MNC quickly deactivate, or turn off, transistors MDA, MDB, and MDC.

The low-to-high transition activates transistor MN1, which immediately applies a low voltage level to node 24. The low voltage level activates transistor MUA in driver circuit 30. Transistor MUA pulls up the voltage at output node 38. Because transistor MUA turns on relatively fast, the voltage level at output node 38 quickly reaches a high logic level, but the available current to output node 38 is limited as the turn-on of transistor MUB and transistor MUC are delayed. Thus, the invention has little or no effect on propagation delay.

Resistor R1 impedes the low-level current drain by transistor MN1 from node 25, thus delaying node 25 from decreasing to a low voltage level. Thus transistor MUB is activated later than transistor MUA. This subsequent activation of transistor MUB provides additional current output to output node 38.

Similarly, resistor R2 further impedes the low-level current drain by transistor MN1 from node 26, thus delaying node 26 from decreasing to a low voltage level. Thus, transistor MUC is activated later than transistor MUB and further provides additional current output to node 38.

Similarly, when a voltage applied to input node 22 transitions from a high-to-low level, driver control circuit 20 activates the lower output cell and deactivates the upper output cell. When the voltage reaches a gate-source threshold Vgs, transistor MP1 of the upper cell and transistors MPA, MPB and MPC of the lower cell are activated, or turned on. Transistors MPA, MPB and MPC quickly deactivate, or turn off, transistors MUA, MUB, and MUC.

The high-to-low transition activates transistor MP1, which immediately applies a high voltage level to node 27. The high voltage level activates transistor MDA in driver circuit 30. Transistor MDA pulls down the voltage at output node 38. Because transistor MDA turns on relatively fast, the voltage level at output node 38 quickly reaches a low logic level, but the current being sinked through output node 38 is limited as the turn-on of transistors MDB and MDL are delayed. Again, the invention has little or no effect on propagation delay.

Resistors R3 and R4 similarly impede the low-level current drain by transistor MP1 from nodes 28 and 29, thus delaying nodes 28 and 29 from increasing to a high voltage level. Transistors MDB and MDC are each in turn subsequently activated later than transistor MDA. These subsequent activations of transistors MDB and MDC allow additional current sinking through output node 38.

Thus, driver control circuit 20 is operable to respond to a single voltage transition at node 22 by activating a single transistor of driver circuit 30 at a time. It is also within the scope of the invention to activate multiple transistors of driver circuit 30 simultaneously with delayed turn-on of at least some of the transistors. In this embodiment, activation of a pull-up transistor in driver circuit 30 sources current to output node 38, and the delayed activation of other pull-up transistors gradually increases the current sourced to output node 38. Similarly, activation of pull-down transistors in driver circuit 30 sinks current from output node 38, and the delayed activation of other pull-down transistors gradually sinks more current from output node 38.

Other transistors, such as bipolar transistors, may also be used without departing from the scope of the invention. Additional resistors may also be used. For example, these resistors may couple transistors MN1 and MP1 to nodes 24 and 27, respectively.

FIG. 2 illustrates a schematic diagram of a second embodiment of an integrated circuit 110 constructed in accordance with the teachings of the present invention. Integrated circuit 110 comprises substantially the same elements as those shown in the lower cell in FIG. 1, with several modifications.

This embodiment is designed to drive an open drain output node. Integrated circuit 110 comprises signal generating circuit 111 and an output driver circuit, which comprises driver control circuit 120 and driver circuit 130. Signal generating circuit 111 may comprise any type of circuit generating a digital signal level. Integrated circuit 110 may be coupled to load circuitry 140. Any load circuitry 140 may be coupled to driver circuit 130 and to a reference voltage VR at output node 138. Although direct connections are illustrated for various elements, elements may be coupled through other elements without departing from the scope of the invention. Driver control circuit 120 may also control sharp edge transitions of a waveform output to load circuitry 140 by activating the plurality of transistors of driver circuit 130 one at a time, as is discussed in conjunction with FIG. 1.

In this embodiment, driver control circuit 120 comprises p-channel MOSFET MP4, and n-channel MOSFET MN3. Driver control circuit 120 also comprises resistors R6 and R8. The gates of each of the transistors are coupled to node 112 and the drains of each of the transistors are each coupled through a resistor to a respective portion of driver circuit 130, at nodes 122 and 126, respectively. Resistors R6 and R8 couple node 122 to node 124 and node 124 to node 126. Resistors R6 and R8 are also each coupled to three portions of driver circuit 130 at nodes 122, 124, and 126, respectively.

In this embodiment, driver circuit 130 comprises substantially the same elements as in the lower output cell as discussed in conjunction with FIG. 1. Driver circuit 130 comprises n-channel MOSFETs MODA, MODB and MODC, whose sources are coupled to ground, and whose drains are each coupled through a resistor to node 138. The gates of transistors MODA, MODB and MODC are each coupled to nodes 122, 124, and 126 of driver control circuit 120, respectively.

In operation, driver control circuit 120 similarly controls the output driver to limit the speed at which current is sinked from output node 138 during edge transitions of a signal at output node 138. In this embodiment, when a voltage at input node 112 transitions from a high-to-low level, driver control circuit 120 activates driver circuit 130 a single transistor at a time, as discussed in conjunction with FIG. 1. For example, the activation of transistor MP4 first applies a high voltage to node 122, activating transistor MODA. The voltage level at output node 138 quickly drops to a low logic level, but the available current sinked from output node 138 is limited as the turn-on of transistors MODB and MODC are delayed. Thus, this embodiment of the invention also has little or no effect on propagation delay. First resistor R6, and then resistor R8, each impedes the low-level current drain by transistor MP4 from nodes 124 and 126, respectively. Thus, transistor MODB, and then transistor MODC, are each subsequently activated. Each transistor sinks additional current from output node 138.

On the other hand, when the voltage at input node 112 transitions from a low-to-high level, driver control circuit 120 deactivates driver circuit 130, one transistor at a time. For example, the low-to-high transition activates transistor MN3, which applies a low voltage level to node 126. The low voltage level first deactivates transistor MODC. Output node 138 quickly pulls up the voltage at output node 138 to a high logic level, but the decrease in current being sinked through output node 138 is limited as the turn-off of transistors MODB and MODA are delayed.

Resistor R8 impedes the low-level current drain by transistor MN3 from node 124, delaying node 124 from decreasing to a low voltage level. Thus transistor MODB is deactivated later than transistor MODC, further decreasing the current being sinked through output node 138. Resistor R6 further impedes the low-level current drain by transistor MN3 from node 122, thus delaying node 122 from decreasing to a low voltage level. Thus transistor MODA is deactivated subsequent to transistors MODC and MODB, and further decreases the current being sinked through output node 138. Each subsequent deactivation of a transistor may thus effectively decrease current sinked through output node 138.

Thus, driver control circuit 120 is operable to respond to a single voltage transition at node 112 by activating or deactivating a single transistor of driver circuit 130 at a time. As discussed above, multiple transistors could be activated or deactivated simultaneously while delaying activation or deactivation of others. In this embodiment, activation of one pull-down transistor in driver circuit 130 sinks current through output node 138, and the delayed activation of other pull-down transistors gradually sinks more current through output node 138. Similarly, deactivation of one pull-down transistor in driver circuit 130 decreases the current sinked through output node 138, and the delayed deactivation of each of the other pull-down transistors decreases, and finally ceases, further drainage of current through output node 138.

It is also within the scope of the invention for driver circuit 130 to comprise any number of transistors controlled by analogous control circuitry, as discussed in conjunction with FIG. 1. Other transistors, such as bipolar transistors, may also be used without departing from the scope of the invention. Additional resistors may also be used to further adjust the rate of current sinking during edge transitions of a signal at output node 138. For example, additional resistors may couple transistors MP4 and MN3 to nodes 122 and 126, respectively.

While the invention has been particularly shown and described by the foregoing detailed description, it will be understood by those skilled in the art that various other changes in form and detail may be made without departing from the spirit and scope of the invention.

What is claimed is:

1. A driver circuit, comprising:
   an output node;
   a first transistor for sinking a first amount of current from the output node when activated;
   a second transistor for sinking a second amount of current from the output node when activated;
   a third transistor coupled to the first transistor and activates the first transistor and the second transistor in response to a transition of a first signal; and
   a first resistive element coupled to the third transistor and to the second transistor, the first resistive element delays activation of the second transistor until after activation of the first transistor;
   a fourth transistor coupled to the second transistor;
   a fifth transistor for sourcing a first amount of current to the output node when activated;
   a sixth transistor for sourcing a second amount of current to the output node when activated;
   a seventh transistor coupled to the fifth transistor, the seventh transistor activates the fifth transistor and the sixth transistor in response to a transition of the first signal; and
   a second resistive element coupled to the seventh and the sixth transistors, the second resistive element delays activation of the sixth transistor until after activation of the fifth transistor;
   an eighth transistor coupled to the first transistor;
   a ninth transistor coupled to the sixth transistor;
   a tenth transistor coupled to the fifth transistor; and
   wherein;
      the fourth and eighth transistors deactivate the second and first transistors, respectively and relatively simultaneously in response to a transition of the first signal from a first logic level to a second logic level; and
      the ninth and tenth transistors deactivate the sixth and fifth transistors, respectively and relatively simultaneously in response to a transition of the first signal from the second logic level to the first logic level.

2. The driver circuit of claim 1, wherein the output node comprises an open drain output node.

3. The driver circuit of claim 1, wherein the first and second resistive elements comprise resistors.

4. A circuit having an input node and an output node, comprising:
   a driver circuit including:
      first and second transistors coupled to the output node; and
   a driver control circuit including:
      third, fourth and fifth transistors coupled to the input node;
      the third transistor activates the first and second transistors in response to a transition of a signal received at the input node;
      a resistive element having a first end coupled to the first, third and fourth transistors and the second end of the resistor coupled to the second and fifth transistors, the resistive element delaying activation of the second transistor after activation of the first transistor; and
      the fourth and fifth transistors deactivate the first and second transistors respectively and relatively simultaneously in response to a transition of the signal received at the input node.

5. A circuit as defined in claim 4, wherein the first transistor sinks a first amount of current from the output node when activated.

6. A circuit as defined in claim 5, wherein the second transistor sinks a second amount of current from the output node when activated.

7. A circuit as defined in claim 4, wherein the first transistor sources a first amount of current to the output node when activated.

8. A circuit as defined in claim 7, wherein the second transistor sources a second amount of current to the output node when activated.

9. A circuit as defined in claim 4, wherein the third transistor activates the first and second transistors upon the signal at the input node transitioning from a first to a second logic level.

10. A circuit as defined in claim 4, wherein the fourth and fifth transistors deactivate the first and second transistors respectively and relatively simultaneously in response to a transition of the signal received at the input node from the second to the first logic level.

11. A circuit as defined in claim 4, wherein the input node is coupled to a signal generating circuit that provides digital signals to the input node.

12. A circuit as defined in claim 11, wherein the output node is coupled to a load circuit.

* * * * *